United States Patent
Egawa et al.

(10) Patent No.: US 7,210,216 B2
(45) Date of Patent: May 1, 2007

(54) METHOD OF PRODUCING SUPERCONDUCTING WIRE

(75) Inventors: Kunihiko Egawa, Tokyo (JP); Yoshio Kubo, Tokyo (JP); Takayuki Nagai, Tokyo (JP); Takanori Sone, Tokyo (JP); Kiyoshi Hiramoto, Tokyo (JP); Masayoshi Wake, Ibaraki (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 145 days.

(21) Appl. No.: 11/057,226

(22) Filed: Feb. 15, 2005

(65) Prior Publication Data

US 2005/0281700 A1  Dec. 22, 2005

(30) Foreign Application Priority Data

Jun. 16, 2004  (JP) ............................. 2004-177763

(51) Int. Cl.
*H01L 39/24* (2006.01)

(52) U.S. Cl. .................. 29/599; 29/825; 174/125.1

(58) Field of Classification Search ................ 29/590; 174/125.1
See application file for complete search history.

(56) References Cited

U.S. PATENT DOCUMENTS 3,905,839 A * 9/1975 Benz ........................... 148/98
3,910,802 A * 10/1975 Wong ......................... 428/608
3,930,903 A * 1/1976 Randall et al. ............. 428/662
3,954,572 A * 5/1976 Ziegler et al. ............... 205/51
4,224,735 A * 9/1980 Young et al. ................ 29/599
4,646,428 A * 3/1987 Marancik et al. ........... 29/599
4,863,804 A * 9/1989 Whitlow et al. ............ 428/555
5,100,481 A * 3/1992 Nakayama et al. .......... 148/98
5,534,219 A   7/1996 Marancik et al.
5,753,862 A * 5/1998 Kubo et al. ............... 174/125.1
5,926,942 A * 7/1999 Kubo et al. .................. 29/599

FOREIGN PATENT DOCUMENTS

JP  9-167531  6/1997
JP  10-512923  12/1998
WO  WO 95/32828  12/1995

* cited by examiner

*Primary Examiner*—Carl J. Arbes
(74) *Attorney, Agent, or Firm*—Oblon, Spivak, McClelland, Maier & Neustadt, P.C.

(57) ABSTRACT

A method of producing $Nb_3Sn$ superconducting wire, including the steps of: preparing a plurality of Sn modules obtained by burying Sn-based metal cores in a Cu-based metal matrix and a plurality of Nb modules obtained by burying Nb-based metal filaments in a Cu-based metal matrix; bundling the Nb modules and the Sn modules such that the Nb modules surround the Sn modules and obtaining an assembly; inserting the assembly in a tubular member of Cu-based metal which internally comprises tube-like shaped Ta-based metal or Nb-based metal which serves as a diffusion barrier and obtaining a composite; drawing the composite; and heat-treating the composite.

10 Claims, 2 Drawing Sheets

US 7,210,216 B2

METHOD OF PRODUCING SUPERCONDUCTING WIRE

CROSS-REFERENCE TO RELATED APPLICATION

The disclosure of Japanese Patent Application No. 2004-177763 filed on Jun. 16, 2004 including specification, drawings and claims is incorporated herein by reference in its entirety

BACKGROUND OF THE INVENTION

1. Field of the Invention

The present invention relates to a method of producing superconducting wire, and more particularly, to method of producing $Nb_3Sn$ superconducting wire.

2. Description of the Related Art

An $Nb_3Sn$ superconducting wire, for stability, a structure in which a great number of superconducting filaments having a diameter of a few scores of micrometers are buried in a metal matrix of Cu or the like which has a small resistivity. This structure is called a multifilamentary wire.

According to a conventional method of producing $Nb_3Sn$ superconducting wire, first, a plurality of Nb/Cu composites (segments) composed of Cu matrix and Nb multifilament, and Sn cores or Sn alloy cores of the same diameter as that of the segments are prepared. Next, the Sn cores or Sn alloy cores are bundled such that they are surrounded by the segments. Then, they are surrounded by an Nb sheet, and they are inserted in a Cu tube. This is followed by drawing to obtain a wire, and then by heat treatment. In consequence, Sn diffuses in the Cu matrix, $Nb_3Sn$ is created around the Nb filaments inside the segments, and an $Nb_3Sn$ superconducting wire is obtained as a multifilamentary wire (JP, 09-16731, A).

SUMMARY OF THE INVENTION

However, with this method of producing $Nb_3Sn$ superconducting wire, the hardness of the segments is remarkably different from that of the Sn cores or Sn alloy cores and the drawing workability is therefore extremely poor. Hence, there is a problem that the wires get broken during drawing and it is thus very difficult to obtain a long wire.

In light of this, the inventors discovered that when Sn cores or Sn alloy cores were covered and integrated with Cu tubes, the drawing workability improved and it was possible to obtain a long wire, thus completing the present invention.

In short, an object of the present invention is to provide a method of producing an $Nb_3Sn$ superconducting wire which has a high critical current density (Jc) characteristic, which is stable and which is particularly suitable as a long wire.

The present invention is directed to a method of producing $Nb_3Sn$ superconducting wire, including the steps of: preparing a plurality of Sn modules obtained by burying Sn-based metal cores in a Cu-based metal matrix and a plurality of Nb modules obtained by burying Nb-based metal filaments in a Cu-based metal matrix; bundling the Nb modules and the Sn modules such that the Nb modules surround the Sn modules; inserting the Nb and Sn modules in a tubular Cu-based metal which internally comprises tube-shaped Ta-based metal or Nb-based metal which serves as a diffusion barrier and obtaining a composite; drawing the composite; and heat-treating the composite.

Use of the method of producing $Nb_3Sn$ superconducting wire according to the present invention makes it possible to obtain an $Nb_3Sn$ superconducting wire which has a high critical current density and favorable drawing workability.

DETAILED DESCRIPTION OF THE PREFERRED EMBODIMENTS

Embodiment 1.

Figure 1:
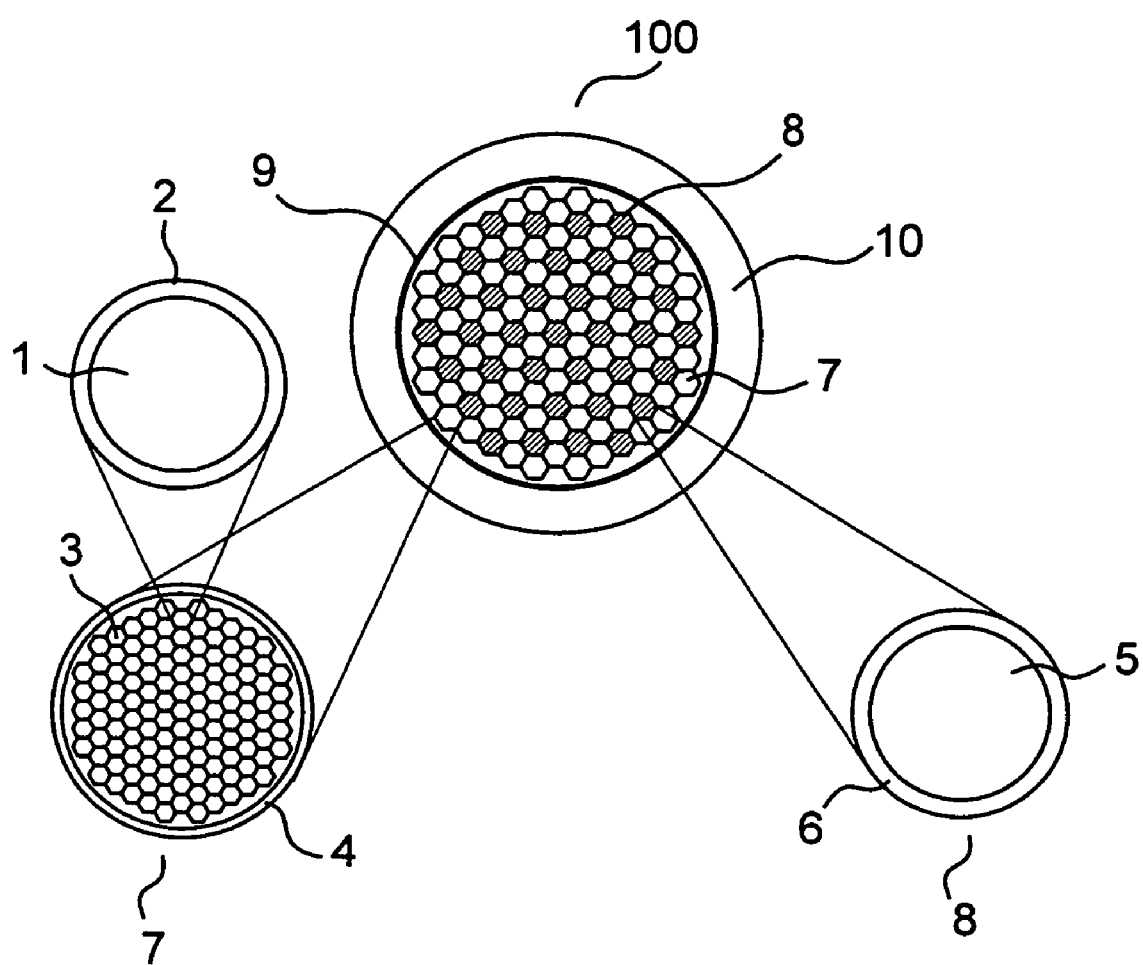
FIG. 1 is a cross-sectional view of the precursor wire for use in the $Nb_3Sn$ superconducting wire according to the embodiment 1 of the present invention.

FIG. 1 is a cross-sectional view of a precursor wire which is used for producing of an $Nb_3Sn$ superconducting wire which has a high critical current density according to the embodiment 1 of the present invention, and the precursor wire is generally denoted at 100. The method of producing $Nb_3Sn$ superconducting wire will now be described with reference to FIG. 1.

According to the method of producing $Nb_3Sn$ superconducting wire, first, an Nb rod 1 is prepared whose size is diameter of 31.2 mm×length of 600 mm. Next, a Cu tube 2 containing Sn is prepared whose size is outer diameter of 35.0 mm×inner diameter of 31.5 mm×length of 600 mm, and the Nb rod 1 is inserted in the Cu tube 2. Following this, this Cu tube 2 is drawn and reduced in diameter until the outer diameter decreases down to 6.1 mm, and further reduced in diameter until the Cu tube becomes hexagonal rod whose length of the opposite side is 5.2 mm. At this step, a Cu/Nb composite rod 3 is obtained whose cross section is approximately hexagonal.

Next, the Cu/Nb composite rod 3 is cut to 175 mm, and thus obtained 121 rods are bundled and inserted in a Cu container 4 containing Sn whose size is outer diameter of 70 mm×inner diameter of 63.5 mm×length of 185 mm.

Next, the Cu container 4 is enclosed with caps at its both ends, and the Cu container 4 and the caps are welded using an electron beam in vacuum and accordingly sealed up, and then HIP-processed and integrated as one, whereby a Cu/multi-Nb composite rod is obtained. The Cu/multi-Nb composite rod is subjected to hot extruding and reduced in diameter until the outer diameter decreases down to 25.0 mm, and the periphery of the Cu/multi-Nb composite rod is machined until the outer diameter becomes 24.5 mm. Further, the Cu/multi-Nb composite rod is drawn and reduced in diameter until the outer diameter decreases down to 2.2 mm, further reduced in diameter until the Cu/multi-Nb composite rod becomes a hexagonal rod whose length of the opposite side is 1.85 mm, and cut to 1000 mm. At this step, Nb modules 7 are completed.

Meanwhile, separately from fabrication of the Nb modules 7, a Sn rod 5 containing In is prepared whose size is diameter of 30.7 mm×length of 300 mm and inserted in a Cu tube 6 containing Sn whose size is outer diameter of 35 mm×inner diameter of 31 mm×length of 300 mm. After the Sn rod is drawn and reduced in diameter until the outer diameter decreases down to 2.2 mm, the Sn rod is further reduced in diameter until the Sn rod becomes a hexagonal rod whose length of the opposite side is 1.85 mm, and cut to 1000 mm. Sn modules 8 which are Cu/Sn composite rods are thus completed.

Next, as shown in FIG. 1, eighty-four Nb modules 7 and thirty-seven Sn modules 8 are arranged and bundled, except for those at the outermost periphery, in such a manner that the outer Sn modules 8 are surrounded by the Nb modules 7 as shown in FIG. 1. Following this, a Ta tube 9 is prepared whose size is outer diameter of 24.5 mm×inner diameter of 24 mm×length of 1000 mm, and the bundle of the Nb modules 7 and the Sn modules 8 is inserted in the Ta tube 9.

Further, a Cu tube 10 is prepared whose size is outer diameter of 34 mm×inner diameter of 26 mm×length of 1000 mm, and the Ta tube 9 is inserted in the Cu tube 10. At this step, a precursor wire 100 whose cross section is as shown in FIG. 1 is formed.

Next, the precursor wire 100 is drawn until the outer diameter decreases down to 0.7 mm. The workability at the drawing step is extremely good and wire having the length of 1800 m without any breakage is obtained. This is because the Sn modules 8 are the Cu/Sn composite rods which are obtained by inserting the soft Sn rod 5 in the Cu tube 6 and the hardness balance of the precursor wire 100 accordingly improves.

This wire is heat-treated at last, whereby an Nb$_3$Sn superconducting wire is obtained. In this example, measurement samples are cut out from drawn wire, then heat-treated in an inert gas atmosphere at 650° C. for ten days, and made as the Nb$_3$Sn superconducting wire. At this step, the Nb$_3$Sn superconducting wire having a high critical current density is completed.

The critical current of obtained superconducting wire was measured at the temperature of liquid helium (4.2 K) in a magnetic field of 12 T and found to be 430 A. The critical current density in non stabilized-copper area (non-Cu Jc) was 2200 A/mm$^2$.

From these results, it is clarified that use of the producing method according to this embodiment makes it possible to obtain an Nb$_3$Sn superconducting wire which has a high critical current density and favorable drawing workability which can not be obtained with the conventional methods.

In the case of the precursor wire 100 according to the embodiment 1, a Sn volume ratio of Sn cores in the Sn modules 8 is 78.1%, a Nb volume ratio of Nb filaments in the Nb modules 7 is 67.7%, and a ratio of the number of the Sn modules 8 to the number of the Nb modules 7 is 1:2.27. Even if the diameters and the lengths of the Nb modules 7 and the Sn modules 8 in the precursor wire 100 are changed, and even if the outer diameters, inner diameters and the lengths of the Ta tube 9 and the Cu tube 10 in the precursor wire 100 are changed, and even if the final diameters and the lengths of the precursor wire 100 are changed, the ratio of Nb volume in the Nb modules 7 is stayed within the range from 50% to 75%, or more preferably, the range from 55% to 70%. In the same manner, the Sn volume ratio in the Sn modules 8 is stayed within the range from 70% to 90%, or more preferably, the range from 75% to 85%.

As for the ratio of the number of the Sn modules 8 to the number of the Nb modules 7, when the number of the Sn modules 8 is 1, the number of the Nb modules 7 is from 1.9 to 2.5, and more preferably, from 1.95 to 2.35.

In the precursor wire 100 having such a structure, Nb in the Nb modules 7 (Nb filaments) and Sn in the Sn modules 8 (Sn cores) are buried in separate Cu matrices and structured as separate modules, and therefore, the volume fractions of the Nb filaments and the Sn cores in the precursor wire 100 are increased. As a result, Nb$_3$Sn superconducting wire with the high Jc properties is able to be obtained, because the Nb$_3$Sn reacted with a high concentration Sn and Nb each other by final heat treatment.

Further, since the Sn modules are arranged surrounding the Nb modules except for those at the outermost periphery, Sn diffusion gets directed inward in such directions that solid angles become narrow and the Sn modules intercept physical or electromagnetic coupling between the Nb modules. Therefore, the performance of the obtained Nb$_3$Sn itself is improved and the Nb$_3$Sn superconducting wire with high Jc and high stability is able to be obtained. Consequently, as mentioned above, it is possible to get the Nb$_3$Sn superconducting wire with non-Cu Jc exceeding 2000 A/mm$^2$ at 4.2 K and 12 T.

In addition, as described above, as the Sn cores are the Sn modules 8 which are buried in the Cu matrix, Cu absorbs the difference in hardness between Nb and Sn and the drawing workability improves. It is therefore possible to easily produce a long length wire.

However, when the Nb volume ratio in the Nb modules 7 is less than 50% or the Sn volume ratio in the Sn modules 8 is less than 70%, it is not possible to obtain the Nb$_3$Sn superconducting wire with such a high current density as that described above, because the amount of Nb$_3$Sn generated by heat-treatment is decreased.

On the contrary, when the Nb volume ratio in the Nb modules 7 is larger than 75% or the Sn volume ratio in the Sn modules 8 is larger than 90%, it is not possible to obtain such a long Nb$_3$Sn superconducting wire as that described above, because the drawing workability becomes considerably poor.

Further, when the ratio of the number of the Sn modules 8 to the number of the Nb modules 7 is that the number of the Nb modules 7 is less than 1.9 relative to the number of the Sn modules 8 of 1, it is not possible to obtain the Nb$_3$Sn superconducting wire with such a high current density as that described above, because the amount of Nb$_3$Sn generated by heat-treatment is decreased by decreasing the amount of Nb compared with Sn. Conversely, when the ratio of the number of the Sn modules 8 to the number of the Nb modules 7 is that the number of the Nb modules 7 is larger than 2.5 relative to the number of the Sn modules 8 of 1, it is not possible to obtain the Nb$_3$Sn superconducting wire with such a high current density as that described above, because the amount of Nb$_3$Sn generated by heat-treatment is decreased by decreasing the amount of Sn compared with Nb.

While the embodiment 1 uses Sn rods whose In dose is 1 wt % as the Sn rods 5 containing In, the In dose is preferably from 0 wt % to 2 wt %, and more preferably, from 0.5 wt % to 1.5 wt %. Since this increases the hardness of the Sn modules and reduces the hardness difference from the Nb modules, it is possible to easily produce a long wire.

However, when the In dose is more than 2 wt %, it is not possible to obtain the Nb$_3$Sn superconducting wire with such a high current density as that realized by the embodiment 1, because the amount of Nb$_3$Sn generated by heat-treatment is decreased by decreasing the amount of Sn. When no In is added on the contrary, although the drawing workability somewhat deteriorates, the method of producing the Sn rods becomes simple and a long wire which is approximately similar to that according to the embodiment 1 is obtained.

Further, while the Sn dose in the Cu tube 2, the Cu container 4 and the Cu tube 6 is 0.15 wt % in the embodiment 1, the Sn dose is preferably from 0 wt % to 2 wt %, and more preferably, from 0.05 wt % to 0.5 wt %. Since such a structure enhances the hardness of the Sn modules and that of the Nb modules, it is possible to more easily produce a long wire.

However, when the Sn dose is more than 2 wt %, the drawing workability becomes considerably poor and such long wire as that described above can not be obtained. When no Sn is added on the contrary, although the drawing workability somewhat deteriorates, the method of producing the Cu tubes and the Cu container becomes simple and a long wire which is approximately similar to that according to the embodiment 1 is obtained.

In addition, although the embodiment 1 uses the Ta tube 9 as a Sn diffusion barrier, a similar effect is attained even using a Ta plate as it is shaped like a tube for instance. Further alternatively, instead of Ta, any Nb-based metal or the like may be used as long as the metal is effective in preventing diffusion of Sn.

Embodiment 2.

Figure 2:
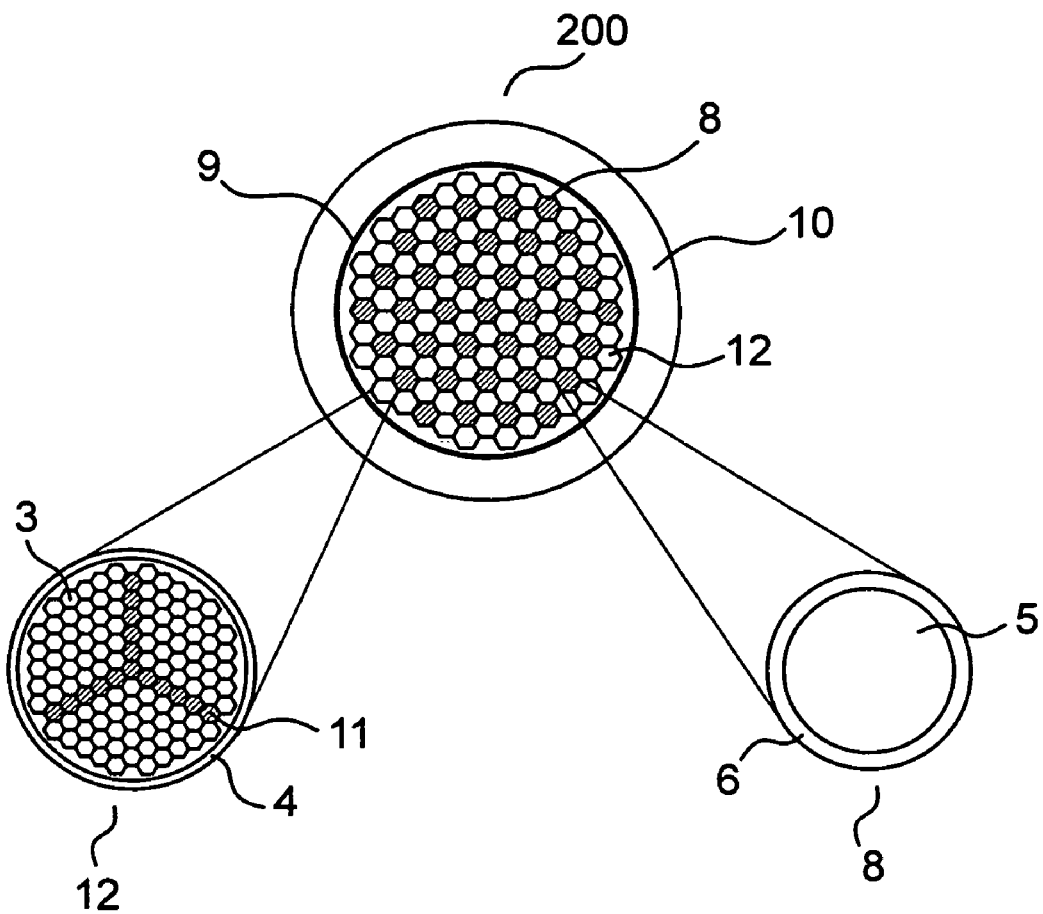
FIG. 2 is a cross-sectional view of the precursor wire for use in the $Nb_3Sn$ superconducting wire according to the embodiment 2 of the present invention.
Figure 3:
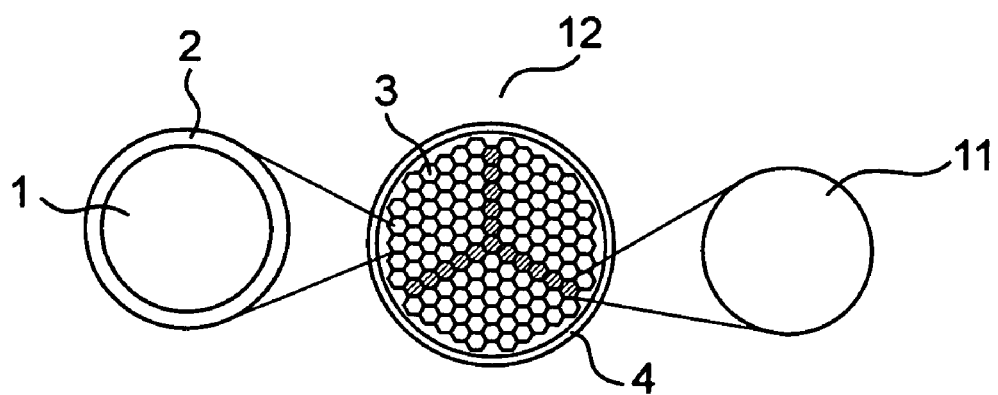
FIG. 3 is a cross-sectional view of the Nb module used in the $Nb_3Sn$ superconducting wire according to the embodiment 2 of the present invention.

FIG. 2 is a cross-sectional view of a precursor wire which is used for producing an $Nb_3Sn$ superconducting wire which has a high critical current density according to the embodiment 2 of the present invention, and the precursor wire is generally denoted at 200. FIG. 3 is a cross-sectional view of an Nb module 12 which is used in the precursor wire 200. In FIGS. 2 and 3, the same reference symbols as those used in FIG. 1 denote the same or corresponding portions.

The method of producing $Nb_3Sn$ superconducting wire will now be described with reference to FIGS. 2 and 3.

According to the method of producing $Nb_3Sn$ superconducting wire, first, as shown in FIG. 3, Nb modules 12 are fabricated in which Nb-based metal filaments are arranged in a Cu-based metal matrix.

To be more specific, a Cu rod containing Sn whose size is diameter of 6.1 mm×length of 3 m is made, and that rod is drawn to a hexagonal rod whose length of the opposite side is 5.2 mm, and cut to 175 mm. In this manner, sixteen Cu rods 11 containing Sn are made. Meanwhile, by a method similar to that according to the embodiment 1, one hundred and five Cu/Nb composite rods 3 are made whose length of the opposite side is 5.2 mm and length is 175 mm.

Next, as shown in FIG. 3, the Cu rods 11 and the Cu/Nb composite rods 3 are bundled such that the Cu rods 11 are lined up in the radius directions which are at 120 degrees with each other. The total number of the Cu rods 11 and the Cu/Nb composite rods 3 is 121.

Next, these are inserted in the Cu container 4 containing Sn whose size is outer diameter of 70.0 mm×inner diameter of 63.5 mm×length of 185 mm. Following this, the Cu container 4 is enclosed with caps at its both ends, and the container and the caps are welded using an electron beam in vacuum and accordingly sealed up, and then HIP-processed and integrated as one, whereby a Cu/multi-Nb composite rod is obtained.

By a method similar to that according to the embodiment 1, the Cu/multi-Nb composite rod is then subjected to hot extruding and reduced in diameter until the outer diameter decreases down to 25 mm, and the periphery of the Cu/multi-Nb composite rod is machined until the outer diameter becomes 24.5 mm. Further, the Cu/multi-Nb composite rod is drawn and reduced in diameter down to 2.2 mm, further reduced in diameter until the Cu/multi-Nb composite rod becomes a hexagonal rod whose length of the opposite side is 1.85 mm. This is cut to 1000 mm at last, whereby the Nb modules 12 shown in FIG. 3 are fabricated.

Meanwhile, by a method similar to that according to the embodiment 1, the Sn modules 8 whose length of the opposite side is 1.85 mm and length is 1000 mm shown in FIG. 2 are fabricated.

Following this, as shown in FIG. 2, eighty-four Nb modules 12 and thirty-seven Sn modules 8 are arranged and bundled, except for those at the outermost periphery, in such a manner that the outer Sn modules 8 are surrounded by the Nb modules 12 as shown in FIG. 2. Next, the Ta tube 9 is prepared whose size is outer diameter of 24.5 mm×inner diameter of 24.0 mm×length of 1000 mm, and the bundle of the Nb modules 12 and the Sn modules 8 is inserted in the Ta tube 9.

Further, the Cu tube 10 is prepared whose size is outer diameter of 34 mm×inner diameter of 26 mm×length of 1000 mm, and the Ta tube 9 is inserted in the Cu tube 10. At this step, the precursor wire 200 whose cross section is as shown in FIG. 2 is formed.

Next, the precursor wire 200 is drawn until the outer diameter decreases down to 0.7 mm. The workability at the drawing step is extremely good and wire material having the length of 1800 m without any breakage is obtained. This is because the Sn modules 8 are the Cu/Sn composite rods which are obtained by inserting the soft Sn rod 5 in the Cu tube 6 and the hardness balance of the precursor wire 200 accordingly improves.

This wire is heat-treated at last, whereby an $Nb_3Sn$ superconducting wire is obtained. In this example, measurement samples are cut out from drawn wire, then heat-treated in an inert gas atmosphere at 600° C. for ten days, and made as the $Nb_3Sn$ superconducting wire. At this step, the $Nb_3Sn$ superconducting wire having a high critical current density is completed.

The critical current of obtained superconducting wire was measured at the temperature of liquid helium (4.2 K) in a magnetic field of 12 T and found to be 390 A. The critical current density in non stabilized-copper area (non-Cu Jc) was 2020 $A/mm^2$.

From these results, it is clarified that use of the producing method according to this embodiment makes it possible to obtain an $Nb_3Sn$ superconducting wire which has a high critical current density and favorable drawing workability which can not be obtained with the conventional methods.

According to the embodiment 2, as described above, in the Nb module 12, the area of the plurality of the Cu/multi-Nb composite rods 3 is divided by the Cu rods 11, which are lined up in the radius directions which are at 120 degrees with each other, into three fan-shaped sections whose central angles are 120 degrees.

In other words, this is a structure that the area where the Nb filaments are buried in a proportional manner in the Cu matrix (i.e., the Nb filament bundles) is partitioned into the three fan-like sections by the area of the Cu rods 11.

By means of this structure, physical or electromagnetic coupling between the Nb filament bundles inside the Nb module 12 is blocked, and an $Nb_3Sn$ superconducting wire which is highly stable is obtained.

In the case of the precursor wire 200 according to the embodiment 2, a Sn volume ratio of Sn cores in the Sn modules 8 is 78.1%, a Nb volume ratio of Nb filaments in the Nb modules 12 is 58.8%, and the ratio of the number of the Sn modules 8 to the number of the Nb modules 12 is 1:2.27. Even if the diameters and the lengths of the Nb modules 12 and the Sn modules 8 in the precursor wire 200 are changed, and even if the outer diameters, inner diameters and the lengths of the Ta tube 9 and the Cu tube 10 in the precursor wire 200 are changed, and even if the final diameters and the lengths of the precursor wire 200 are changed, the ratio of Nb volume in the Nb modules 12 is stayed within the range from 50% to 75%, or more preferably, the range from 55% to 70%. In the same manner, the Sn volume ratio in the Sn modules 8 is stayed within the range from 70% to 90%, or more preferably, the range from 75% to 85%.

As for the ratio of the number of the Sn modules 8 to the number of the Nb modules 12, when the number of the Sn modules 8 is 1, the number of the Nb modules 12 is from 1.9 to 2.5, and more preferably, from 1.95 to 2.35.

When the Nb volume ratio in the Nb modules 12 is less than 50% or the Sn volume ratio in the Sn modules 8 is less than 70%, it is not possible to obtain the $Nb_3Sn$ superconducting wire with such a high current density as that described above, because the amount of $Nb_3Sn$ generated by heat-treatment is decreased.

On the contrary, when the Nb volume ratio in the Nb modules 12 is larger than 75% or the Sn volume ratio in the Sn modules 8 is larger than 90%, it is not possible to obtain such a long $Nb_3Sn$ superconducting wire as that described above, because the drawing workability becomes considerably poor.

Further, when the ratio of the number of the Sn modules 8 to the number of the Nb modules 12 is that the number of the Nb modules 12 is less than 1.9 relative to the number of the Sn modules 8 of 1, it is not possible to obtain the $Nb_3Sn$ superconducting wire with such a high current density as that described above, because the amount of $Nb_3Sn$ generated by heat-treatment is decreased by decreasing the amount of Nb compared with Sn.

Conversely, when the ratio of the number of the Sn modules 8 to the number of the Nb modules 12 is that the number of the Nb modules 12 is larger than 2.5 relative to the number of the Sn modules 8 of 1, it is not possible to obtain the $Nb_3Sn$ superconducting wire with such a high current density as that described above, because the amount of $Nb_3Sn$ generated by heat-treatment is decreased by decreasing the amount of Sn compared with Nb.

While the area where the Nb filaments are buried in proportional manner in the Cu-based metal matrix is divided into the three fan-shaped sections whose central angles are 120 degrees by the Cu-based metal matrix inside the Nb module 12 according to the embodiment 2, a similar effect is attained even when the number of the divided sections is other than 3 as long as the ratio of Nb volume in the Nb modules 12 is from 50% to 75%, or more preferably, the range from 55% to 70%.

Further, although the foregoing has described that the Cu rods 11 containing Sn are used as the partitioning material, other metal such as Ta rods for instance may be used instead which can block physical or electromagnetic coupling between the Nb filaments inside the Nb modules. Still further, although the foregoing has described that a plurality of rods are used as the shape of as the partitioning material, other shape such as a plate-like shape may be used instead which is effective in blocking physical or electromagnetic coupling between the Nb filaments inside the Nb modules.

While Sn rods whose In dose is 1 wt % are used as the Sn rods 5 containing In according to the embodiment 2, similar effect is attained even using Sn-based metal rods whose In dose is preferably from 0 wt % to 2 wt %, and more preferably, from 0.5 wt % to 1.5 wt %.

However, when the In dose is more than 2 wt %, it is not possible to obtain the $Nb_3Sn$ superconducting wire with such a high current density as that realized by the embodiment 2, because the amount of $Nb_3Sn$ generated by heat-treatment is decreased by decreasing the amount of Sn. When no In is added on the contrary, although the drawing workability somewhat deteriorates, the method of producing the Sn rods becomes simple and a long wire which is approximately similar to that according to the embodiment 2 is obtained.

Although the embodiment 2 uses Cu rods, a Cu tube and Cu container whose Sn dose is 0.15 wt % as the Cu rods 11 containing Sn, the Cu tube 2 containing Sn, the Cu container 4 containing Sn and the Cu tube 6 containing Sn, Cu rods, a Cu tube and a Cu container whose Sn dose is from 0 wt % to 2 wt %, and more preferably, from 0.05 wt % to 0.5 wt % may be used.

However, when the Sn dose is more than 2 wt %, the drawing workability becomes considerably poor and such a long wire as that described above can not be obtained. When no Sn is added on the contrary, although the drawing workability somewhat deteriorates, the method of producing the Cu rods, the Cu tube and the Cu container becomes simple and a long wire as that described above is obtained.

Although the embodiment 2 uses the Ta tube 9 as a Sn diffusion barrier, a Ta plate or the like as it is shaped like a tube for instance may be used as the barrier. Further, although Ta is used as the material of the Sn diffusion barrier, other metal such as Nb-based metal may be used instead which is effective in preventing diffusion of Sn.

In the present invention, Cu-based metal refers to pure Cu or Cu which contains Sn in the amount of 2 wt % or less.

Nb-based metal refers to pure Nb or Nb which contains at least one of Ta of 10 wt % or less, or Ti of 5 wt % or less.

Sn-based metal refers to pure Sn or Sn which contains at least one of Ti of 5 wt % or less, or In of 2 wt % or less.

What is claimed is:

1. A method of producing $Nb_3Sn$ superconducting wire, comprising the steps of:
   preparing a plurality of rod-shaped Sn modules each obtained by burying a Sn-based metal core in a matrix comprising a first Cu-based metal;
   preparing a plurality of rod-shaped Nb modules each obtained by burying Nb-based metal filaments in a matrix comprising a second Cu-based metal;
   bundling the Nb modules and the Sn modules, such that each of the Nb modules surrounds the Sn modules, to obtain an assembly;
   introducing the assembly into a tubular member comprising a first tube, and a second tube inside the first tube, where the first tube comprises a third Cu-based metal and the second tube comprises Ta-based metal or Nb-based metal, which serves as a diffusion barrier, to obtain a composite;
   drawing the composite; and
   heat-treating the composite.

2. The producing method according to claim 1, wherein a volume ratio of Sn-based metal in the Sn modules is from 70% to 90% and a volume ratio of Nb-based metal in the Nb modules is from 50% to 75%.

3. The producing method according to claim 1, wherein a ratio of the number of the Nb modules to the number of the Sn modules is from 1.9 to 2.5.

4. The producing method according to claim 1, wherein the area where the Nb-based metal filaments are buried is divided by the Cu-based metal matrices into a plurality of fan-shaped sections.

5. The producing method according to claim 1, wherein the Sn-based metal cores contain from 0 wt % to 2 wt % of In.

6. The producing method according to claim 1, wherein the first Cu-based metal and the second Cu-based metal independently contain from 0 wt % to 2 wt % of Sn.

7. The producing method according to claim 1, wherein each of the Sn modules is obtained by inserting one of the Sn-based metal cores into a tube comprising the first Cu-based metal.

8. The producing method according to claim 1, wherein each of the Nb modules is obtained by a process comprising bundling together Cu/Nb composite rods, where each of the Cu/Nb composite rods is obtained by inserting one of the Nb-based filaments into a tube comprising the second Cu-based metal.

9. The producing method according to claim 8, wherein a cross-section of one of the plurality of Nb modules comprises fan-shaped sections of the Cu/Nb composite rods, where the fan-shaped sections are separated from each other by rods comprising a fourth Cu-based metal.

10. The producing method according to claim 1, wherein the first Cu-based metal, the second Cu-based metal, the third Cu-based metal and the fourth Cu-based metal have the same composition.

* * * * *